United States Patent
Natori

(10) Patent No.: US 7,340,670 B2
(45) Date of Patent: Mar. 4, 2008

(54) DECODING APPARATUS, COMMUNICATION APPARATUS AND DECODING METHOD

(75) Inventor: Makoto Natori, Saitama (JP)

(73) Assignee: Sony Ericsson Mobile Communications Japan, Inc., Tokyo (JP)

( * ) Notice: Subject to any disclaimer, the term of this patent is extended or adjusted under 35 U.S.C. 154(b) by 354 days.

(21) Appl. No.: 10/926,089

(22) Filed: Aug. 26, 2004

(65) Prior Publication Data

US 2005/0066260 A1    Mar. 24, 2005

(30) Foreign Application Priority Data

Sep. 19, 2003    (JP)    ............................. 2003-328414

(51) Int. Cl.
*H03M 13/03*    (2006.01)
(52) U.S. Cl. ...................................... 714/795; 714/799
(58) Field of Classification Search ................ 714/795, 714/793, 794, 798, 799; 375/262, 341
See application file for complete search history.

(56) References Cited

U.S. PATENT DOCUMENTS

| | | | | |
|---|---|---|---|---|
| 5,208,816 A | * | 5/1993 | Seshardi et al. | ............ 714/795 |
| 5,568,330 A | * | 10/1996 | Sawaguchi et al. | ........... 360/46 |
| 5,881,075 A | * | 3/1999 | Kong et al. | ................. 714/795 |
| 5,917,859 A | * | 6/1999 | Yamasaki et al. | ........... 375/262 |
| 5,933,462 A | * | 8/1999 | Viterbi et al. | ................ 375/341 |
| 6,671,852 B1 | * | 12/2003 | Ariel et al. | .................. 714/793 |
| 2001/0033626 A1 | * | 10/2001 | Symes et al. | ............... 375/341 |
| 2004/0001428 A1 | | 1/2004 | Datta et al. | |

FOREIGN PATENT DOCUMENTS

| | | |
|---|---|---|
| EP | 1 339 188 A1 | 8/2003 |
| EP | 1 355 430 A1 | 10/2003 |
| JP | 09-074404 | 3/1997 |
| JP | 10-302412 | 11/1998 |

OTHER PUBLICATIONS

"Digital Baseband Architecture Scenarios for a Multi-Mode Radio", Internet Article, 'Online!, http://www.mumor.org/public/deliverables/d31_unis_dr_re_009_final.pdf>, XP-002308697, Oct. 25, 2004, pp. 1-63.

(Continued)

*Primary Examiner*—Guy Lamarre
*Assistant Examiner*—Fritz Alphonse
(74) *Attorney, Agent, or Firm*—Oblon, Spivak, McClelland, Maier & Neustadt, P.C.

(57) ABSTRACT

A decoding apparatus includes simultaneous decoding means for sequentially Viterbi-decoding a plurality of data sequences over respective data lengths from the start at the same time, and stop means for sequentially comparing likelihoods of respective data sequences which are simultaneously Viterbi-decoded by the simultaneous decoding means and stopping the simultaneous decoding means from decoding a certain data sequence if it is determined based upon the compared result that a likelihood of the certain data sequence is lower than a threshold value.

10 Claims, 8 Drawing Sheets

OTHER PUBLICATIONS

"Control Channel Structure for High Speed DSCH (HS-DSCH)", Motorola, TSG-RAN Working Group 1 Meeting #16, XP-002206394, Oct. 10, 2000, pp. 1-3.

Amitava Ghosh, et al., "Control Channel Design for High Speed Downlink Shared Channel for 3GPP W-CDMA, Rel-5", IEEE Semiannual Vehicular Technology Conference, vol. 3 of 4, Conf. 57, XP-002301166, Apr. 22, 2003, pp. 2085-2089.

"Comparison of Detection Schemes for the HS-SCCH", Lucent Technologies, 3GPP TSG-RAN WG1#25, XP-002301167, May 13-16, 2002, pp. 1-8.

"Performance of the HS-SCCH", Lucent Technologies, 3GPP TSG-RAN WG1#25, XP-002301041, Apr. 9-12, 2002, pp. 1-12.

"Way forward on HS-SCCH coding", Lucent Technologies, 3GPP TSG-RAN WG1#25, XP-002308698, Apr. 9-12, 2002, pp. 1-6.

\* cited by examiner

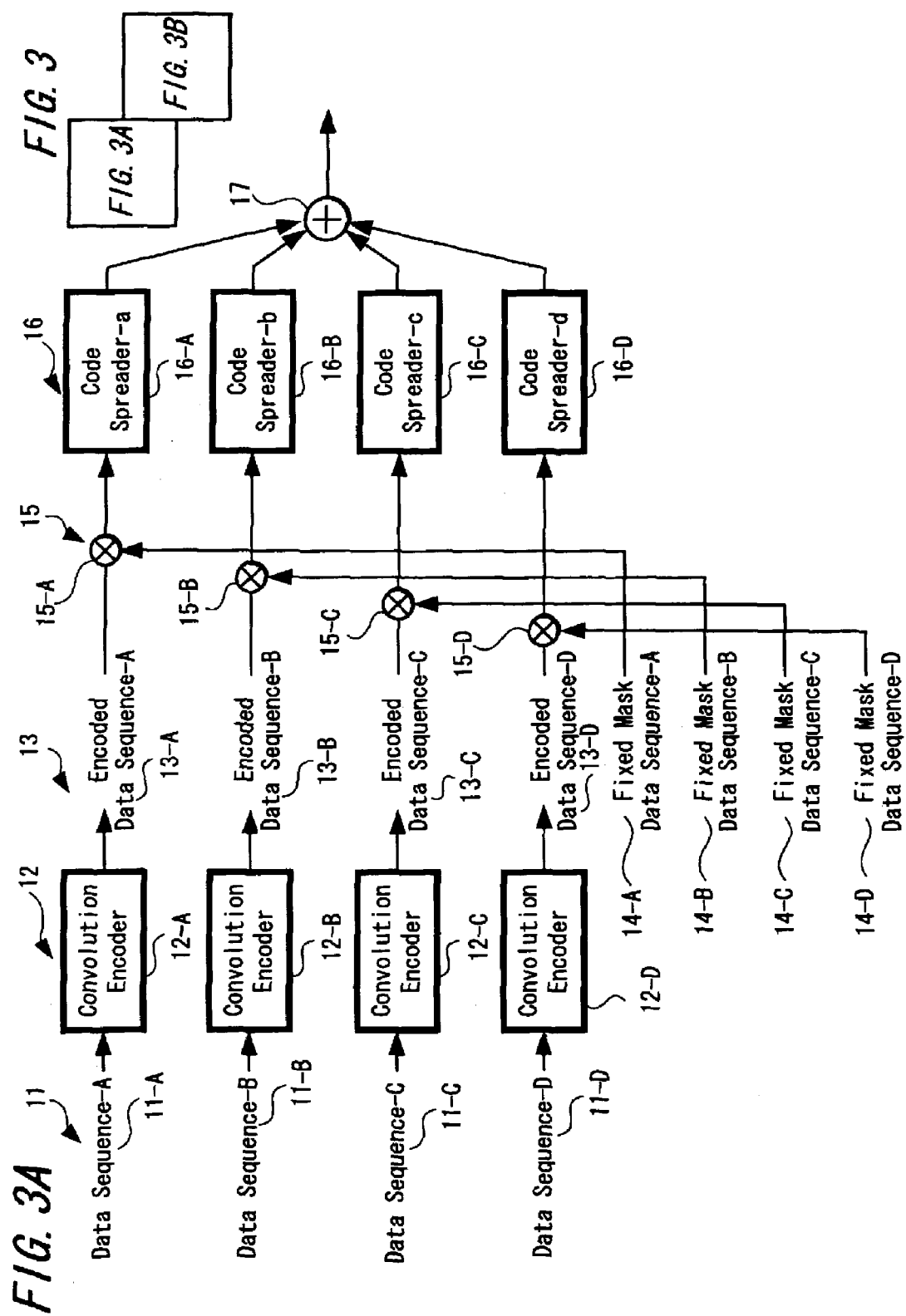

DECODING APPARATUS, COMMUNICATION APPARATUS AND DECODING METHOD

BACKGROUND OF THE INVENTION

1. Field of the Invention

The present invention relates to a decoding apparatus, a communication apparatus and a decoding method in which a plurality of data sequences are simultaneously received and Viterbi-decoded to judge a desired data sequence. More particularly, this invention is suitable for use with a Viterbi decoder and a data judging unit that can be applied to the reception system of an HS-SCCH (Shared Control Channel for HS-DSCH)channel which is part of W-CDNA (Wideband-Code Division Multiple Access) system, for example.

2. Description of the Related Art

In a decoding apparatus in which a plurality of data sequences are simultaneously received and any one of a plurality of data sequences encoded by data sequences assigned to each predetermined communication apparatus from a plurality of data sequences is Viterbi-decoded to thereby judge a desired data sequence, the judgment processing has been so far executed, which will be described below.

First, a plurality of data sequences are decoded at every data sequence by a single Viterbi decoder and all data sequences are processed, whereafter likelihoods of respective data sequences are compared with each other to judge validity of data sequence.

Secondly, when validity of data sequence is judged, it is customary to normalize the likelihood obtained by the Viterbi decoding in order to decrease a bit width of likelihood information. As a result, the likelihood of data obtained finally becomes different in standard at every data sequence so that the likelihood of data cannot be compared with each other without modification.

FIG. 1 of the accompanying drawings is a flowchart to which reference will be made in explaining a decoding/judging algorithm according to the related art.

Referring to FIG. 1, and following the start of operation, control goes to a step S21, whereat a processed counter value i of a plurality of data sequences is set to 1 (i=1). Control goes to the next decision step S22, whereat it is determined whether or not the processed counter value i≦4 (i=1, 2, 3, 4) is satisfied. That is, it is determined whether or not all of processing of a plurality of data sequences is ended. If the processed counter value i≦4 is satisfied as represented by a "TRUE" at the decision step S22, then control goes to a step S23, whereat a data length counter value j is set to 0 (j=0). If on the other hand the processed counter value i≦4 is not satisfied as represented by a "FALSE" at the decision step S22, then control goes to a step S28.

It is determined at the decision step S24 whether or not the data length counter value j is smaller than the data length (data length counter value j<data length). If the inequality of the data length count value j<data length is satisfied as represented by a "TRUE" at the decision step S24, then control goes to a step S25, whereat data length of every data sequence-Ni is Viterbi-decoded.

At the same time, likelihood information (State Metric value) is normalized. More specifically, in order to decrease a dynamic range, each time data is processed, all state metric values are subtracted by the minimum value of the state metric value. Then, an accumulatively added value of the state metric minimum values obtained each time data is processed, which is the resultant normalized information, is held.

At a step S26, the data length count value j is incremented (j=j+1), and control goes back to the step S24. At the step S24, the processing is repeated until the inequality of data length counter value j<data length is not satisfied. When the inequality of data length counter value j<data length is not satisfied any more, control goes to a step S27. At the step S27, the processed counter value i is incremented (i=i+1), and control goes back to the decision step S22. If the processed count value i≦4 is not satisfied as represented by a "FALSE" and the Viterbi decoding is ended, then control goes to a step S28, whereat likelihoods of the decoded results are compared with each other.

At that time, respective normalized information values are added to the state metric value of the most likelihood results of each decoded data sequence, whereafter likelihoods of respective data sequences are compared with each other. Then, it is determined by comparing the value in which the state metric value+normalized information value, which becomes the most likelihood, become the minimum value with a threshold value whether or not expected data could be received.

Also, the cited patent reference 1 discloses a serial Viterbi decoder which is suitable for use in, particular, code division multiple access (CDMA) wireless communication system, that is, a serial Viterbi decoder that can decode a convolutional-coded code string by using a chain-back memory for storing a decided bit to each of a plurality of processing cycles.

[Cited Patent Reference 1]

Official Gazette of Japanese laid-open patent application No. 2002-522944

In the above-mentioned decoding and judgment algorithm, offset values which become differences with threshold values required when they are normalized in order to compare likelihoods of a plurality of data sequences should be held and reflected on the final judgment of likelihoods. Alternatively, there was required a means for convolutional-coding data based on the decoded data sequence, calculating likelihoods with received data and judging data based upon the calculated result.

However, in the above first judgment processing, a data sequence of which likelihood is explicitly judged to be low in the data sequence decoding should be decoded to the end for comparison, and useless processing is increased unavoidably.

Also, in the above second judgment processing, an amount of data to be processed to compare likelihoods is increased and the processing becomes complicated.

Further, in the cited patent reference 1, the decoder allows the chain-back memory to hold decided bits from the preceding processing cycle as a cache so that the full chain-back operation need not always be executed but the decoding processing itself should not be stopped. As a result, the useless processing is increased similarly as described above.

SUMMARY OF THE INVENTION

In view of the aforesaid aspect, it is an object of the present invention to provide a decoding apparatus, a communication apparatus and a decoding method in which any one of a plurality of data sequences can be Viterbi-decoded by a simple processing to judge a desired data sequence without useless processing after normalized information has been reflected on the judgment.

According to an aspect of the present invention, there is provided a decoding apparatus which is comprised of a simultaneous decoding unit for sequentially Viterbi-decoding a plurality of data sequences over respective data lengths from the start at the same time and a stop unit for sequentially comparing likelihoods of respective data sequences which are simultaneously Viterbi-decoded by the simultaneous decoding unit and stopping the simultaneous decoding unit from decoding a certain data sequence if it is determined based upon the compared result that a likelihood of the certain data sequence is lower than a threshold value.

According to other aspect of the present invention, there is provided a decoding apparatus which is comprised of a decoding unit for sequentially Viterbi-decoding a plurality of data sequences over respective data lengths from the start at the same time and a control unit for sequentially comparing likelihoods of respective data sequences which were simultaneously Viterbi-decoded by the decoding means and stopping the decoding means from stopping a certain data sequence if it is determined based upon said the compared results if a likelihood of the certain data sequence is lower than a predetermined threshold value.

According to a further aspect of the present invention, there is provided a communication apparatus which is comprised of a simultaneous decoding unit for sequentially Viterbi-decoding a plurality of data sequences over respective data lengths from the start at the same time and a stop unit for sequentially comparing likelihoods of respective data sequences which are simultaneously Viterbi-decoded by the simultaneous decoding unit and stopping the simultaneous decoding unit from decoding a certain data sequence if it is determined based upon the compared result that a likelihood of the certain data sequence is lower than a threshold value.

According to yet a further aspect of the present invention, there is provided a communication apparatus which is comprised of a decoding unit for sequentially Viterbi-decoding a plurality of data sequences over respective data lengths from the start at the same time and a control unit for sequentially comparing likelihoods of respective data sequences which were simultaneously Viterbi-decoded by the decoding unit and stopping the decoding unit from stopping a certain data sequence if it is determined based upon the compared results if a likelihood of the certain data sequence is lower than a predetermined threshold value.

These decoding apparatus and communication apparatus are adapted to simultaneously receive and decode a plurality of data sequences, for example, and are adapted to judge a desired data sequence by Viterbi-decoding any one of a plurality of data sequences coded by a data sequence assigned to each predetermined communication apparatus from a plurality of data sequences.

According to these decoding apparatus and communication apparatus, since the simultaneous decoding unit sequentially Viterbi-decodes a plurality of data sequences over respective data lengths from the start at the same time, it becomes possible to judge at somewhere of the position from the start of the data length whether or not a data sequence is a useless data sequence that need not be processed. The stop unit sequentially compares likelihoods of respective data sequences which were simultaneously Viterbi-decoded by the simultaneous decoding means. Thus, if it is determined based upon the compared result that a likelihood of a certain data sequence is lower than a specific threshold value, then the stop unit stops the simultaneous decoding means from decoding that data sequence, and all data sequences need not be decoded but the decoding of unnecessary data sequences which need not be processed is stopped. As a result, the useless processing can be decreased.

In accordance with still a further aspect of the present invention, there is provided a decoding method for judging a desired data sequence by Viterbi-decoding any one of a plurality of data sequences coded by a data sequence assigned to each predetermined communication apparatus from a plurality of data sequences received simultaneously comprising the steps of a simultaneous decoding step for sequentially Viterbi-decoding a plurality of data sequences over respective data lengths from the start at the same time and a stop step for sequentially comparing likelihoods of respective data sequences which are simultaneously Viterbi-decoded by the simultaneous decoding step and stopping the simultaneous decoding step from decoding a certain data sequence if it is determined based upon the compared result that a likelihood of the certain data sequence is lower than a threshold value.

According to the above-described present invention, when propagation situation, for example, is relatively satisfactory, if a difference between likelihood information between data sequences is large and if expecting received data is judged with ease, the decoding processing can be stopped and hence power consumption can be decreased.

Also, when likelihood information is normalized, if a shared value is used among respective data sequences, then an amount of data that is handled as normalization information for most likelihood comparison can be decreased, which can therefore decrease power consumption.

DESCRIPTION OF THE PREFERRED EMBODIMENTS

The present invention will now be described below with reference to the drawings.

Figure 1:
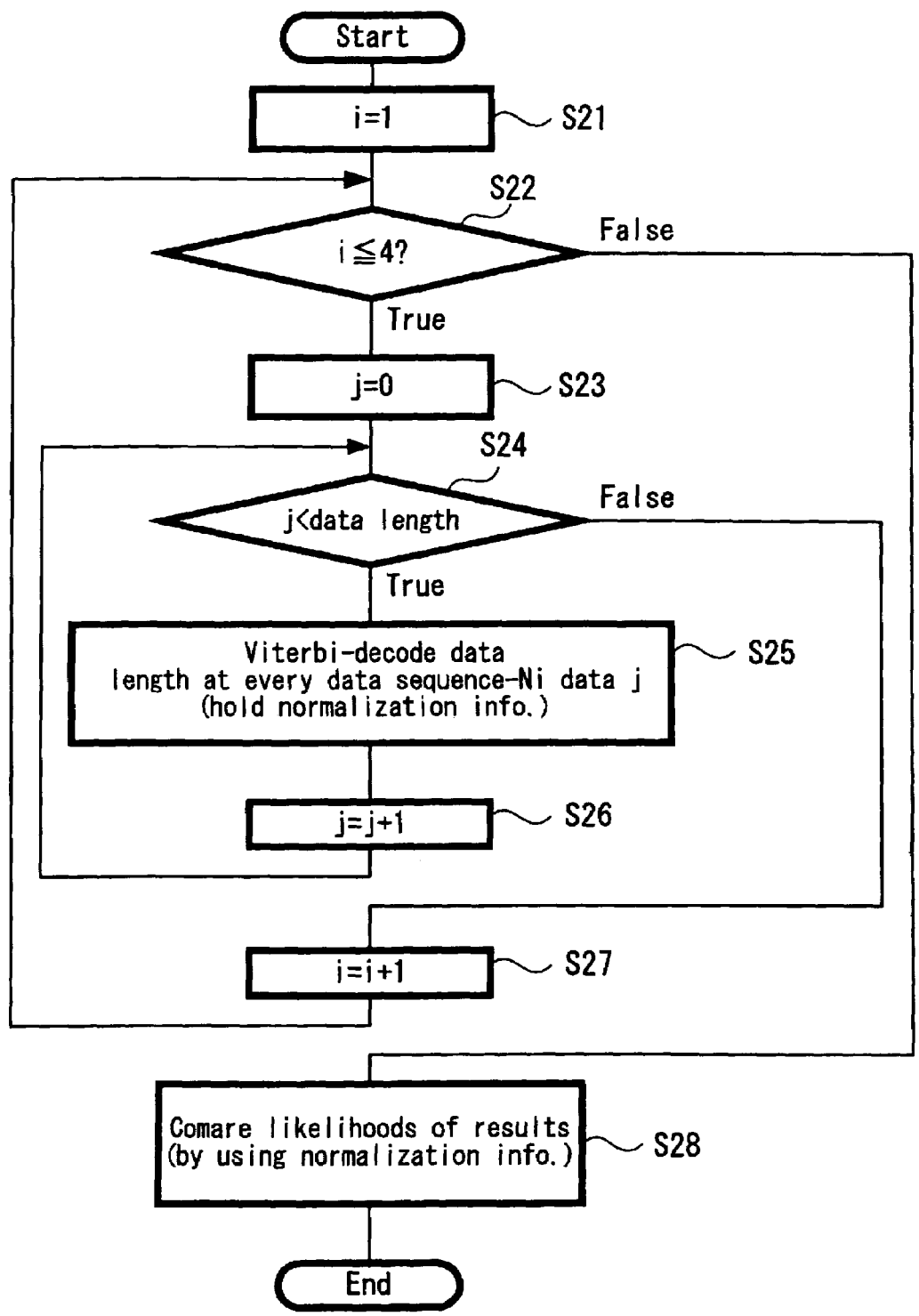
FIG. 1 is a flowchart to which reference will be made in explaining a decoding/judging algorithm according to the related art.
Figure 2:
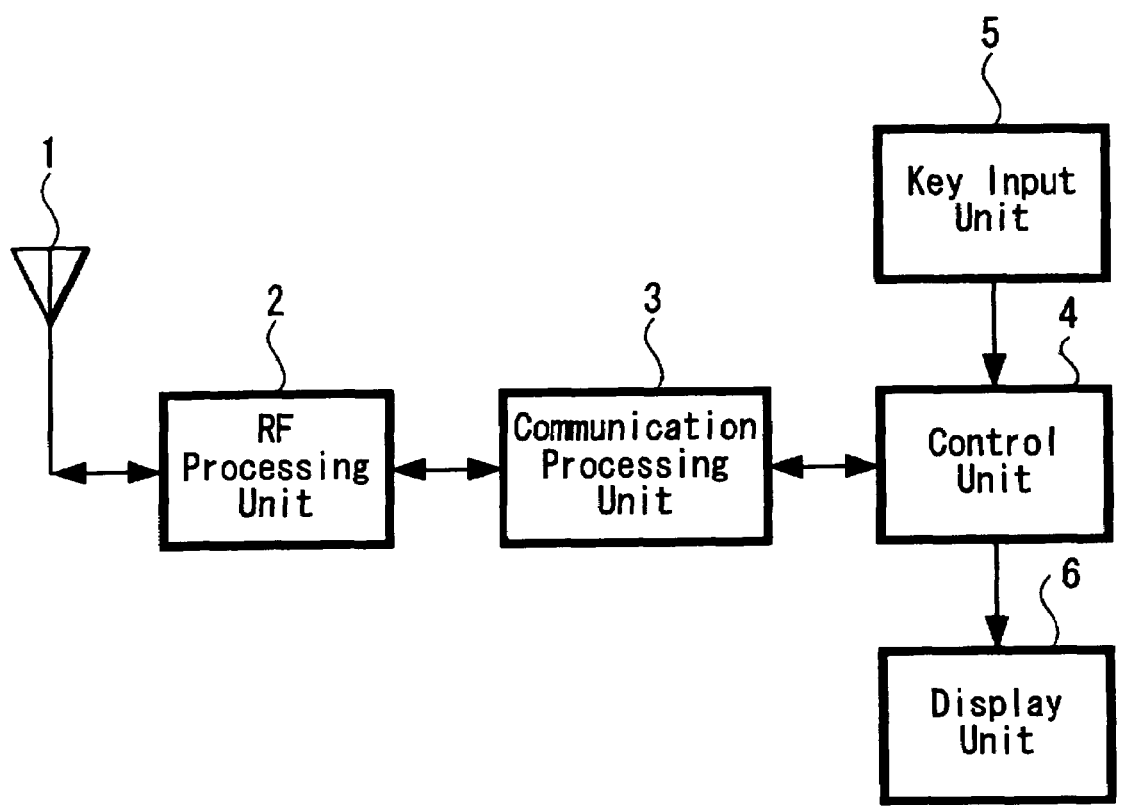
FIG. 2 is a block diagram showing an arrangement of a mobile device to which the embodiment of the present invention is applied.

FIG. 2 is a block diagram showing an arrangement of a mobile device to which a decoding apparatus according to the embodiment of the present invention is applied. It is assumed that this mobile device has an arrangement that can be applied to a W-CDMA (Wideband-Code Division Multiple Access) system.

Upon transmission, in a communication processing unit 3, after a CRC (Cyclic Redundancy Check) code for detecting a block error at a data fundamental unit (unit at which data is transferred from an MAC (Medium Access Control) layer to a certain layer), processed by a certain layer (physical layer) has been added to transmission data, the resultant transmission data is channel-coded (error-correction-coded) and then interleaved.

The thus interleaved bit sequence is added with an overhead such as a pilot bit that is used to estimate a channel and is then modulated. The thus modulated and mapped in-phase and quadrature phase components on the phase plane are respectively spread by spread-code sequences of two hierarchies.

After the thus spread chip data sequence has been band-limited to the 5 MHz band by a square cosine root Nyquist filter (not shown), it is converted into an analog signal by a D/A (digital-to-analog) converter and is then quadrature-converted. An intermediate frequency signal that has been quadarature-converted at the RF processing unit 2, it is further frequency-converted into an RF signal of the 2 GHz band, amplified in power and transmitted to the outside through the antenna 1 via wireless communication.

Upon reception, as shown in FIG. 2, a received signal inputted to the mobile device through the antenna 1 via wireless communication is amplified by a low-noise amplifier (not shown) in the RF processing unit 2, it is frequency-converted from a high frequency to an intermediate frequency and is then linearly amplified by an automatic gain control amplifier (not shown).

Also, in the communication processing unit 3, the thus amplified signal is quadrature-detected and thereby in-phase and quadrature-phase components are generated. The analog signals with the in-phase and quadrature-phase components are converted into digital signals by an A/D (analog-to-digital) converter (not shown).

Further, after the in-phase and quadrature-phase components that were converted into the digital values are band-limited by a root Nyquist filter (not shown), they are inverse-spread by the same spread code as that of the thus spread received signal and are thereby time-separated into a plurality of multi-path components with different propagation delay times.

The thus time-separated paths are combined in a coherent RAKE combination fashion. After the thus RAKE-combined data sequence is interleaved and error-correction decoded by channel decoding, binary data are judged and thereby a transmission data sequence is reproduced. The reproduced data sequence is separated into respective transport channels and detected in block error and thereby reproduced data is outputted.

The outputted reproduced data is transferred to a high-order layer application software processing unit (not shown) of a control unit 4. When a user enters data into a key input unit 5 by keys, the high-order layer application software processing unit of the control unit 4 displays the reproduced data and the reproducing state on a display unit 6.

In the error-correction decode processing of the communication processing unit 3 in the above-mentioned mobile device, a decoding apparatus according to this embodiment is applied to this error-correction decode processing. This decoding apparatus will be described below.

Figure 3B:
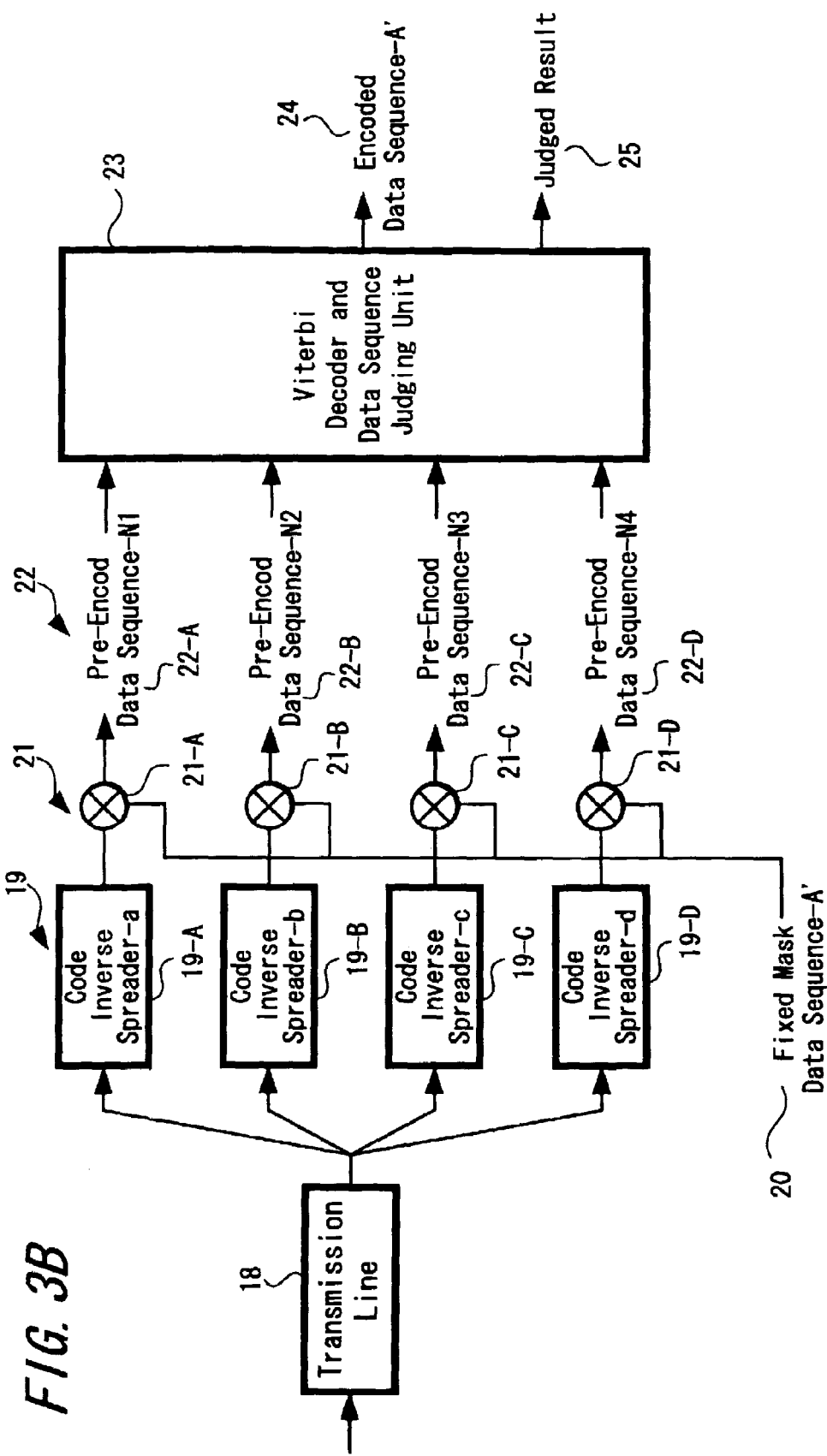
FIG. 3 (formed of FIGS. 3A and 3B so as to permit a suitably large scale) is a block diagram showing an outline of a system using the mobile device according to the present invention.

The decoding apparatus according to this embodiment will be described below with reference to a system block diagram of FIG. 3. FIG. 3 is formed of FIGS. 3A and 3B so as to permit the use of a suitably large scale, and this system block of FIG. 3 is created having considered the reception system (3 GPP (3rd Generation Partnership Project) standard TS25,21x (stipulated by Release 5) of HS-SCCH channel, which is part of the W-CDMA system, into consideration.

This HS-SCCH (Shared Control channel) for an HS-DSCH channel is a control channel for use with the HS-DSCH (High Speed Downlink Shared Channel) channel that is used to transmit shared user data and the like to a terminal device from a base station.

First, as shown in FIG. 3A, data sequences are generated from transmission sides 11 to 17. The thus generated data sequences are transmitted through a transmission line 18, which is shown simplified, and received data 24 and judged result 25 are generated from reception sides 19 to 23. In the embodiment of the present invention, a Viterbi decoder and data judging unit 23 on the reception side can be improved in order to decrease an amount of data to be processed therein. The present invention will be described in detail below.

The transmission side is able to transmit four data sequences of data sequence-A (11-A), data sequence-B (11-B), data sequence-C (11-C), data sequence-D (11-D) to a plurality of receivers at the same time. These data are supplied to convolution encoders 12-A, 12-B, 12-C and 12-D, each of which has the same coding rate, in which they are encoded and thereby produced as encoded data sequence-A (13-A), encoded data sequence-B (13-B), encoded data sequence-C (13-C) and encoded data sequence-D (13-D), respectively.

These encoded data sequences 13-A, 13-B, 13-C, 13-D and fixed mask data sequence-A (14-A), fixed mask data sequence-B (14-B), fixed mask data sequence-C (14-C), fixed mask data sequence-D (14-D) are calculated in a logical OR fashion (that is, ORed) by logical OR circuits 15-A, 15-B, 15-C, 15-D, resultant data are spread by a plurality of a code spreader-a 16-A, a code spreader-b 16-B, a code spreader-c 16-C, a code spreader-d 16-D using a plurality of quadrature spread codes and added by an adder 17, whereafter added data is transmitted as a transmission symbol through a transmission line 18.

In the reception side, the transmitted data is separated by a code inverse-spreader-a 19-A, a code inverse-spreader-b 19-B, a code inverse-spreader-c 19-C, a code inverse-spreader-d 19-D using the spread codes which were used by the spreaders 16-A, 16-B, 16-C, 16-D. More specifically, the same fixed mask data sequence-A'20 as the fixed mask data sequence-A (14-A) for use with the received data sequence-A (11-A) and the outputs of the inverse-spreaders 19-A, 19-B, 19-C, 19-D are calculated in a logical OR fashion (that is, ORed) by logical OR circuits 21-A, 21-B, 21-C, 21-D, respectively, and thereby four pre-decode data sequence-A (22-A), pre-decode data sequence-B (22-B), pre-decode data sequence-C (22-C), pre-decode data sequence-D (22-D).

The four pre-decode data sequence-Ni (22-A), pre-decode data sequence-N2 (22-B), pre-decode data sequence-N3 (22-C), pre-decode data sequence-N4 (22-D) (Ni: i=1, 2, 3, 4) are decoded and judged by a Viterbi decoder and data judging unit 23 and thereby produced as decoded data sequence-A' 24. Then, a judged result 25 is used to display a message indicating that desired data is not contained in the data.

Figure 4:
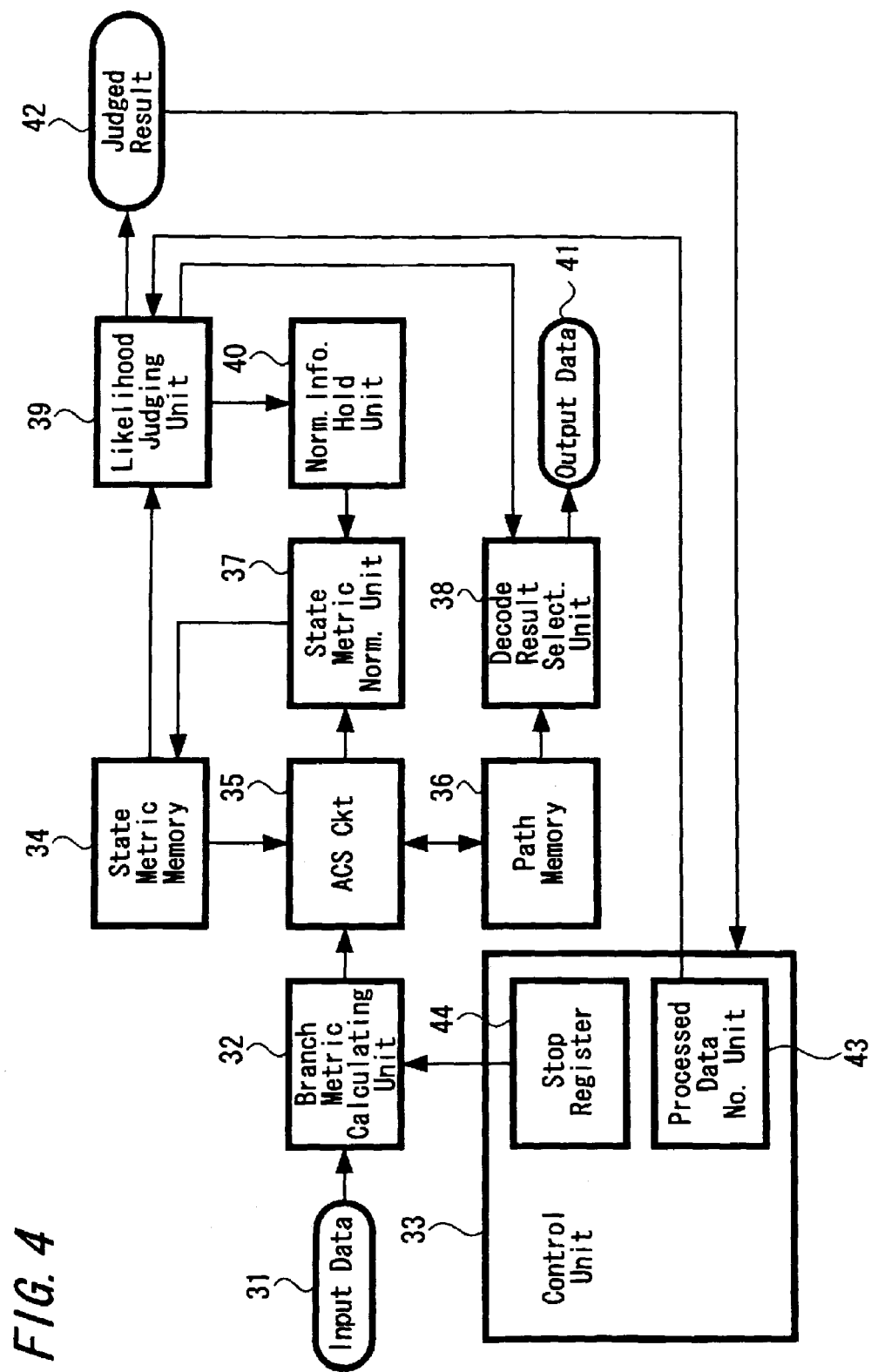
FIG. 4 is a block diagram showing an arrangement of a Viterbi decoder/data judging unit according to the embodiment of the present invention.

FIG. 4 is a block diagram showing an arrangement of a Viterbi decoder and data judging unit 23 (see FIG. 3) according to the embodiment of the present invention.

As shown in FIG. 4, first, a control unit 33 controls the whole operation of the Viterbi decoder and data judging unit 23 (see FIG. 3). Input data 31 is supplied to a branch metric (Branch Metric) calculating unit 32. The branch metric (Branch Metric) calculating unit 32 calculates a branch metric (Branch Metric) value. The thus calculated branch metric (Branch Metric) value is supplied to an ACS (Add-Compare-Select) circuit 35. The ACS circuit 35 judges each path by using both the branch metric (Branch Metric) value and a state metric (State Metric) value read out from a state metric (State Metric) memory 34.

The path judged result is written in a path (Path) memory 36 and is also supplied to a state metric (State Metric) normalizing unit 37. The state metric (State Metric) normalizing unit 37 normalizes the state metric (State Metric) value and writes the thus normalized state metric value in the state metric (State Metric) memory 34.

Normalizing information of a normalizing information holding unit 40 is updated each time processing of one data amount over the data length from the start of all data sequences in a likelihood judging circuit 39 is ended. At the time in which the processing of all data sequences is ended, the likelihood judging circuit 39 judges based upon the state metric (State Metric) value read out from the state metric (State Metric) memory 34 whether or not an expecting data sequence is detected from a most likelihood state metric (State Metric) value, and produces a judged result 42. Also, the likelihood judging circuit 39 supplies the judged result 42 to a decode result selecting unit 38. The decode result selecting unit 38 selects the decode result of the thus detected expecting data sequence and outputs the selected decode result as output data 41.

The likelihood judging circuit 39 judges a likelihood of data sequence by using processed data number j of one data amount over the data length from the start supplied from a processed data number unit 43 of the control unit 33. When the processing is stopped based upon the likelihood judgment, the judged result 42 is supplied to the control unit 33, a stop register 44 in the control unit 33 holds the judged result 42 and supplies a stop command of calculation operation to the branch metric (Branch Metric) calculating unit 32. As a result, the processing is stopped by the branch metric (Branch Metric) calculating unit 32.

As examples of circuits which are mounted on the mobile device in actual practice, the state metric (State Metric) memory 34 and the path (Path) memory 36 are required to have storage capacities of four memories which are connected in parallel. The ACS circuit 35 and the state metric (State Metric) normalizing unit 37 may process data by using a pair of memories or may use four memories connected in parallel to increase execution speed by executing one at a time the processing for normalizing the likelihood with shared normalizing information, which will be described later on.

Figure 5:
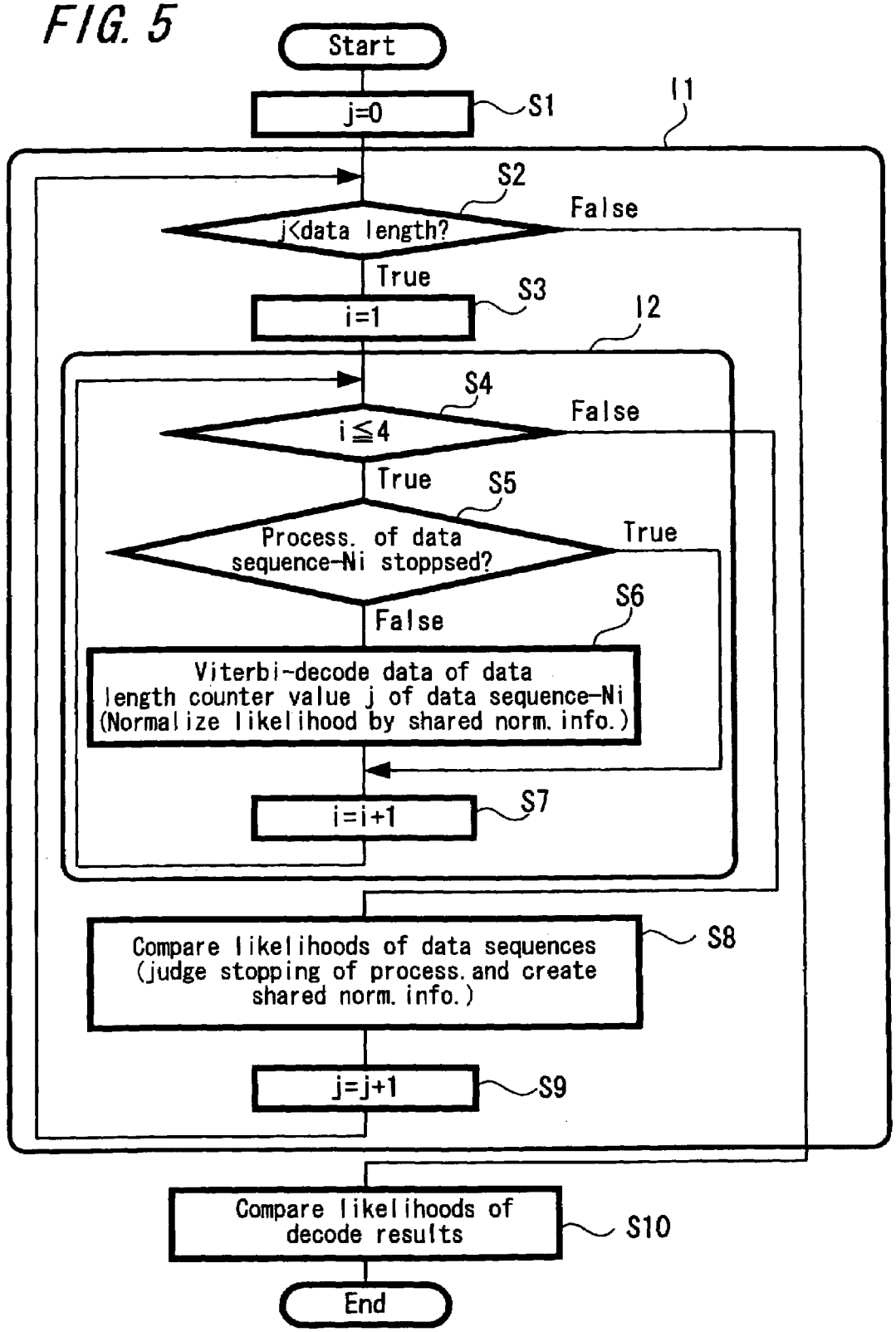
FIG. 5 is a flowchart to which reference will be made in explaining a decoding/judging algorithm according to the embodiment of the present invention.

FIG. 5 is a flowchart showing a decoding and judging algorithm according to the embodiment of the present invention.

In particular, in the data processing, the present invention is different from the related art in that "data of data length counter value j indicating the sequential order from the start" of each data sequence is processed continuously or at the same time in each data sequence, a likelihood of data sequence is judged at every "data of data length counter value j indicating the sequential order from the start", the processing of a data sequence of a specific data sequence is stopped based on the situations if it is determined based on the likelihood compared result that a likelihood of a certain data sequence is lower than a specific threshold value and that a state metric (State Metric) value which becomes minimum in all data sequences is used as shared normalizing information to normalize a state metric (State Metric) value required in the next Viterbi decoding.

As shown in FIG. 5, this algorithm includes an outer loop 11 for sequentially processing j-th data of data length counter value indicative of the sequential order of each data sequence from the start and an inner loop 12 for processing each data sequence Ni sequentially.

Referring to FIG. 5, and following the start of operation, in the outer loop 11, data length counter value j=0 is set at a step S1 (j=0).

Control goes to the next decision step S2 whether or not data length counter value j<data length is satisfied. That is, it is determined whether or not the processing of all data length has been finished. If a data length counter value j<data length is satisfied as represented by a "TRUE" at the decision step S2, then control goes to a step S3, whereat a processing counter value i of a plurality of data sequences is set to 1 (i=1).

Next, in the inner loop 12, it is determined at a decision step S4 whether or not a data sequence processing counter value i≦4 (i=1, 2, 3, 4) is satisfied. That is, it is determined all processing of a plurality of data sequences is ended. If data sequence processing counter value i≦4 is satisfied as represented by a "TRUE" at the decision step S4, then control goes to a step S5. If data sequence processing counter value i≦4 is not satisfied as represented by a "FALSE" at the decision step S4, then control goes to a step S8.

It is determined at the decision step S5 whether or not the processing of the processed data sequence Ni is stopped. That is, if it is determined based upon a likelihood compared result, which will be described later on, that the likelihood of the processed data sequence Ni is lower than a specific threshold value, then the processing of the processed data sequence Ni is stopped. Thus, the useless processing can be decreased. If on the other hand the processing of the processed data sequence Ni is not stopped as represented by a "FALSE" at the decision step S5, then control goes to a step S6. If the processing of the processed data sequence Ni is stopped as represented by a TRUE" at the decision step S5, then control goes to a step S7.

At the step S6, data of data length counter value j is Viterbi-decoded at every data sequence-Ni.

Here, the state metric (State Metric) value normalized by the previous shared normalizing information is stored in the state metric memory 34 (see FIG. 4).

As described above, in the inner loop 12, depending on the situation under which it is determined that the processing of the processed data sequence Ni is stopped, it is determined whether or not the data length counter value j of the data sequence Ni is Viterbi-decoded.

At the step S7, the data sequence processing counter value i is incremented and control goes back to the step S4, whereat the processing is repeated. If data sequence processing counter value j≦4 is not satisfied as represented by a "FALSE" at the decision step S4, then when the inner loop 12 is ended and the Viterbi decoding of data length counter value j of all data sequences Ni is ended, then control goes to a step S8 of the outer loop 11. At the step S8, the likelihoods between the data sequences are compared with each other. That is, a threshold value is set by which it can be determined whether or not the most likelihood state metric (State Metric) value becomes minimum and by which it can be determined whether or not the minimum state metric (State Metric) value of a certain data sequence, which becomes the standard of judgment to stop the processing of the data sequence Ni processed at the above-mentioned step S5 is larger than the threshold value to stop the minimum state metric (State Metric) value of a certain data sequence.

At a step S9, the data length counter value j is incremented (j=j+1), and control goes back to the step S2. Then, the processing is repeated until it is determined that data length counter value j<data length is not satisfied. If data length counter value j<data length is not satisfied, then the processing of the outer loop 11 is ended and control goes to a step S10, whereat the likelihoods of the decoded results are compared with each other. More specifically, it is determined whether or not the resultant data is regarded as data in which the state metric (State Metric) value which becomes finally the most likelihood state metric value exists. This judgment can be made when a difference between minimum state metric (State Metric) values of data sequences exceeds a relative detected threshold value or if an added value of an accumulated value of shared normalizing information and the final most likelihood state metric (State Metric) value when data amount of data length counter value j is Viterbi-decoded at every data sequence-Ni at the step S6 becomes lower than an absolute detected threshold value.

The judgment at the above decision step S5 for determining whether or not the processing of the data sequence Ni is stopped need not always be carried out at every data. If such judgment is started from a data length having a large possibility that the static metric value will exceed the threshold value for stopping the processing of the data sequence Ni, for example, from the latter half of the data, then the judgment processing can be prevented from becoming useless. Also, if the above judgment is carried out at every several data after the judgment for stopping the processing of the data sequence Ni was started, the judgment processing can be decreased. In addition, if the processing of the-data sequence of which processing was stopped once is never processed, then the processing can be decreased.

Figure 6:
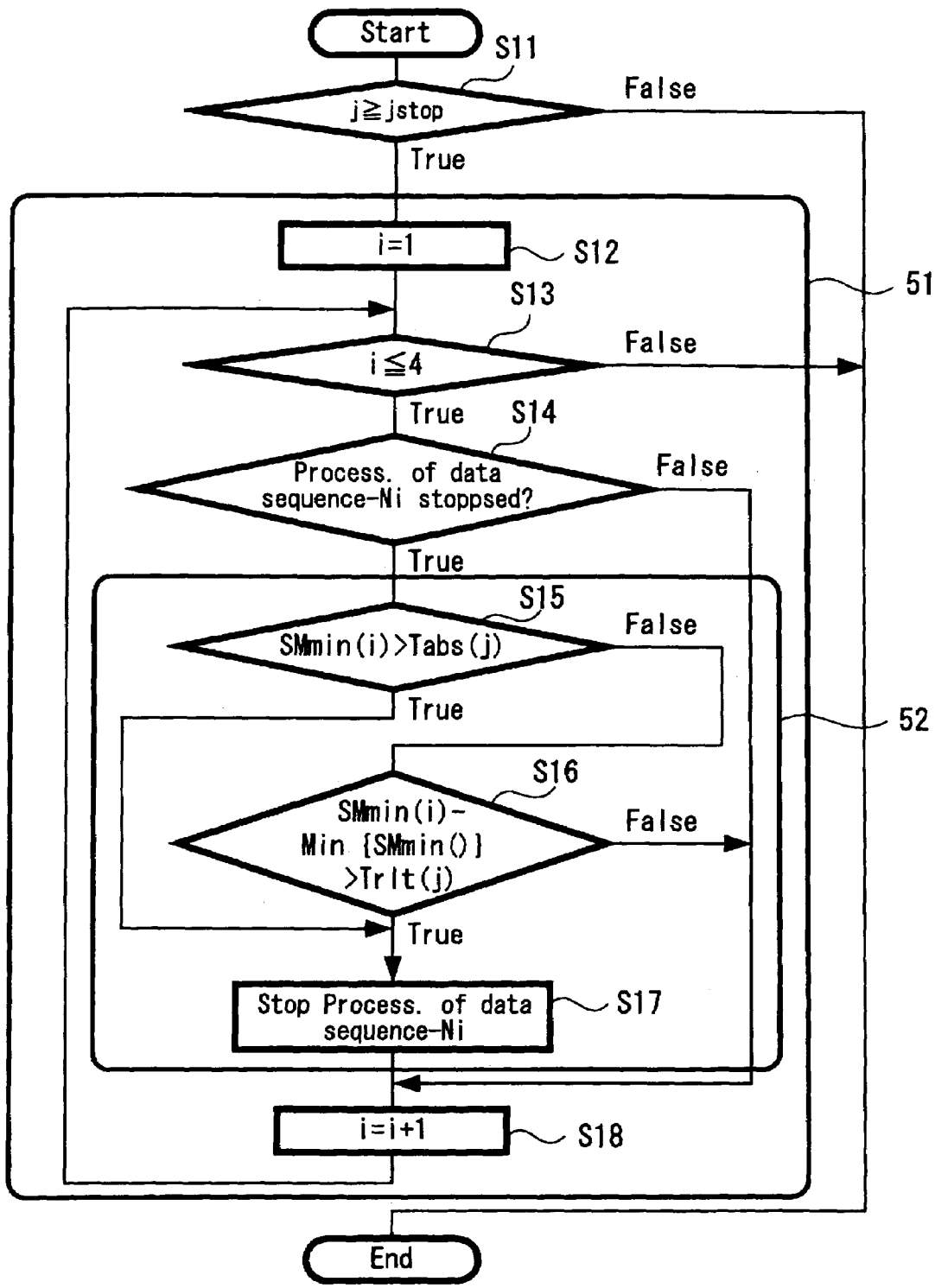
FIG. 6 is a flowchart to which reference will be made in explaining a likelihood comparing algorithm according to the embodiment of the present invention.

FIG. 6 is a flowchart showing a likelihood comparing algorithm. FIG. 6 shows operations of likelihood comparing processing between the data sequences at the step S8 (FIG. 5) in detail.

Referring to FIG. 6, and following the start of operation, it is determined at a decision step S11 whether or not data length counter value j≧jstop is satisfied. If data length counter value j≧jstop is satisfied as represented by a "TRUE" at the decision step S11, then control goes to a step S12. If on the other hand data length counter value j≧jstop is not satisfied as represented by a "FALSE" at the decision step S11, then control is ended.

More specifically, if the number j that indicates the sequence of data from the start of the processed data becomes greater than the number jstop indicative of the stop processing start data length, then the processing of a likelihood comparison processing unit 51 for stopping the processing of the data sequence at steps S12 to S19 and the processing of a likelihood stop judging unit 52 shown at steps S15 to S17 are executed.

First, in the likelihood comparison processing unit 51, the processing counter value i of a plurality of data sequences is set to 1 (i=1) at a step S12.

It is determined at the next decision step S13 whether or not a data sequence processing counter value i≦4 (i=1, 2, 3, 4) is satisfied. That is, it is determined whether or not all processing of a plurality of data sequences is ended. If data sequence processing counter value i≦4 is satisfied as represented by a "TRUE" at the decision step S13, control goes to the next decision step S14. If on the other hand data sequence processing counter value i≦4 is not satisfied as represented by a "FALSE" at the decision step S13, then control is ended.

It is determined at the decision step S14 whether or not the processing of the processed data sequence Ni was not already stopped. If the processed data sequence Ni was not already stopped as represented by a "TRUE" at the decision step S14, then control goes to the next decision step S15. If on the other hand the processed data sequence Ni was already stopped as represented by a "FALSE" at the decision step S14, then control goes to a step S18. In the step S18, the data sequence processing counter value i is incremented (i=i+1) and control goes back to the decision step S13, whereat the processing is repeated.

In other words, the processing of the likelihood stop judging unit 52 is not effected on the data sequence Ni which was determined that the processing was already stopped, and the processing of the likelihood judging unit 52 is effected on only the data sequence Ni which was judged that the processing is to be stopped.

Next, in the likelihood stop judging unit 52, it is determined at the decision step S15 whether or not minimum value SMin(i) of the state metric (State Metric) value>absolute value comparing threshold value Tabs(j) is satisfied. If the minimum value SMin(i) of the state metric (State Metric) value>absolute value comparing threshold value Tabs(j) is satisfied as represented by a "TRUE" at the decision step S15, then control goes to a step S17. If on the other hand the minimum value SMin(i) of the state metric (State Metric) value>absolute value comparing threshold value Tabs(j) is not satisfied as represented by a "FALSE" at the decision step S15, then control goes to the next decision step S16.

In other words, the absolute value comparing threshold value Tabs(j) and the minimum value SMin(i) in the state metric (State Metric) value obtained after the data length j of the data sequence Ni was processed are compared with each other. If the minimum value SMin(i) is larger than the threshold value Tabs(j), then it is decided that the processing of this data sequence Ni should be stopped.

It is determined at the decision step S16 whether or not minimum value SMin(i) of state metric (State Metric) value−minimum value Min {SMin( )} of each data sequence>relative value comparing threshold value Tr1t(j) is satisfied. If minimum value SMin(i) of state metric (State Metric) value−minimum value Min {SMin( )} of each data sequence>relative value comparing threshold value Tr1t(j) is satisfied as represented by a "TRUE" at the decision step S16, then control goes to a step S17. At the step S17, the processing of the data sequence Ni is stopped. If on the other hand If minimum value SMin (i) of state metric (State Metric) value−minimum value Min {SMin( )} of each data sequence>relative value comparing threshold value Tr1t(j) is not satisfied as represented by a "FALSE" at the decision step S16, control goes to the step S18, whereat the data sequence processing counter value i is incremented (i=i+1), whereafter control goes back to the decision step S13 and thereby the processing is repeated.

In other words, the absolute value comparing threshold value Tr1t(j) and the value which results from subtracting minimum values Min{SMin(1), SMin(2), SMin(3), SMin(4)} of respective data sequences from the minimum value SMin(i) of the state metric (State Metric) value are compared with each other. If the minimum value is larger than the threshold value Tr1t(j), then it is decided that the processing of this data sequence Ni should be stopped.

The absolute value comparing threshold value Tabs(j) and the relative value comparing threshold value Tr1t(j) can be set to be freely changeable in accordance with the value of the number j indicative of the sequential order of the data from the start of the processed data, thereby making it possible to optimize those threshold values Tabs(j) and relative value comparing threshold value Tr1t(j).

Figure 7:
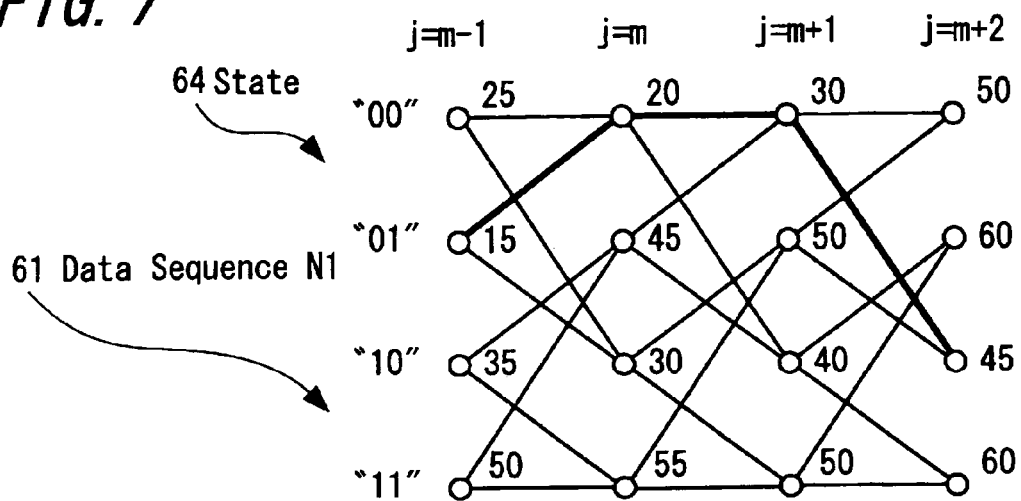
FIG. 7 is a diagram showing trellis diagrams and state metric values in respective data sequences.
Figure 7:
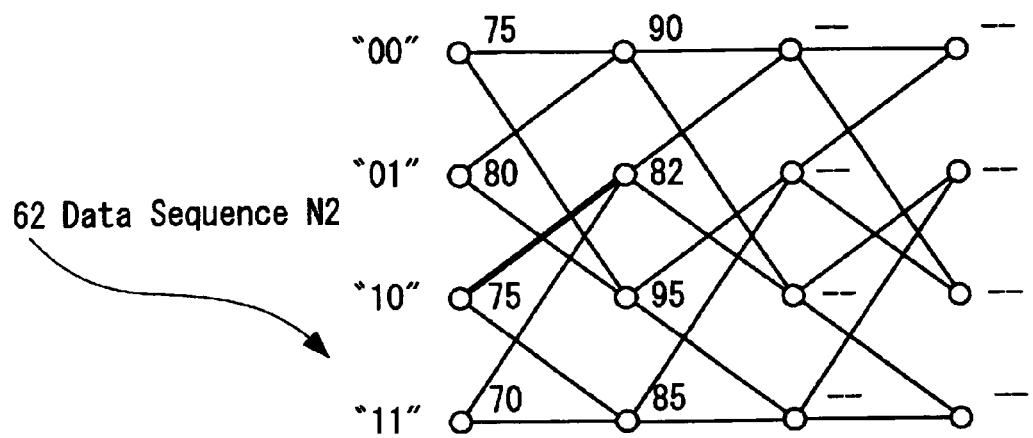
Figure 7:
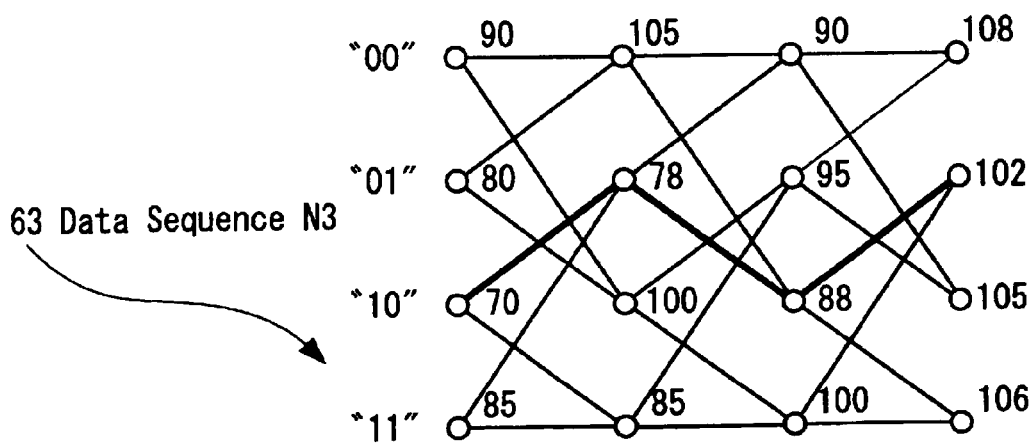

FIG. 7 is a diagram showing trellis diagrams in respective data sequences and state metric (State Metric) values. FIG. 7 shows the compared results of the minimum value SMin(i) in the state metric (State Metric) values in actual practice and that the processing of this data sequence Ni is stopped by using the absolute value comparing threshold value Tabs(j) and the relative value comparing threshold value Tr1t(j).

In FIG. 7, let us describe the present invention on the assumption that absolute value comparing threshold value Tabs(j)=100, relative value comparing threshold value Tr1t(j)=60 and the number jstop indicating the stop processing start data length=m. The left-hand side of FIG. 7 shows state (State) values "00", "01", "10", "11" obtained when a two-bit state (State) 64 is assumed to every data sequence of data sequences N1 (61), N2 (62), N3 (63).

Numerical values on the trellis diagrams of FIG. 7 show state metric (State Metric) values at each state (State) 64. The numerical values of the state metric (State Metric) values are arbitrary values for the sake of reference.

First, in the number j=m−1 that indicates the sequential order of the data from the start of the processed data, j<jstop is satisfied so that likelihoods between the data sequences are not compared with each other.

Next, in the number j=m indicating the sequential order of the data from the start of the processed data, since the minimum value SMin(1)=20, SMin(2)=82, SMin(3)=78 of the state metric (State Metric) values are satisfied, the minimum value SMin(2) of the state metric (State Metric) value−minimum value Min {SMin( )} of each data sequence>relative value comparing threshold value Tr1t(j) is satisfied, and hence the processing of the data sequence N2 is stopped.

In the number j=m+1 indicating the sequential order of the data from the start of the processed data, since the minimum value SMin(1) of the state metric (State Metric) value=30 and the minimum value SMin(3)=88 are satisfied, which does not correspond to the conditions to stop the processing. Hence, the processing of the data sequences N1, N3 is continued.

In the number j=m+2 indicating the sequential order of the data from the start of the processed data, since the minimum values of the state metric (State Metric) values SMin(1)=45, SMin(3)=102 are satisfied, the minimum value SMin(3) of the state metric (State Metric) value>absolute value comparing threshold value Tabs(j) is satisfied, and hence the processing of the data sequence N3 is stopped.

Also, in the processing for comparing likelihoods of the decoded results at the above-mentioned step S10 shown in FIG. 5, the minimum values of the state metric (State Metric) value with respect to the data sequences whose processing is not stopped are compared with each other by using final data length absolute value comparing threshold value Tabs-last. If the compared result is smaller than the threshold value Tabs-last, then it can be recognized that there exists data which will be supplied to the mobile device.

In the above-mentioned case, when the absolute value comparing threshold value Tabs(j), the final data length absolute value comparing threshold value Tabs-last are compared with the minimum value SMin of the state metric (State Metric) value, there is used the minimum value SMin which is not normalized or the minimum value SMin which results from correcting data corresponding to normalized information.

According to the present invention, there is provided a decoding apparatus which is comprised of a simultaneous decoding unit for sequentially Viterbi-decoding a plurality of data sequences over respective data lengths from the start at the same time and a stop unit for sequentially comparing likelihoods of respective data sequences which are simultaneously Viterbi-decoded by the simultaneous decoding unit and stopping the simultaneous decoding unit from decoding a certain data sequence if it is determined based upon the compared result that a likelihood of the certain data sequence is lower than a threshold value.

According to the present invention, there is provided a decoding apparatus which is comprised of a decoding unit for sequentially Viterbi-decoding a plurality of data sequences over respective data lengths from the start at the same time and a control unit for sequentially comparing likelihoods of respective data sequences which were simultaneously Viterbi-decoded by the decoding means and stopping the decoding means from decoding a certain data sequence if it is determined based upon the compared results if a likelihood of the certain data sequence is lower than a predetermined threshold value.

According to the present invention, there is provided a communication apparatus which is comprised of a simultaneous decoding unit for sequentially Viterbi-decoding a plurality of data sequences over respective data lengths from the start at the same time and a stop unit for sequentially comparing likelihoods of respective data sequences which are simultaneously Viterbi-decoded by the simultaneous decoding unit and stopping the simultaneous decoding unit from decoding a certain data sequence if it is determined based upon the compared result that a likelihood of the certain data sequence is lower than a threshold value.

According to the present invention, there is provided a communication apparatus which is comprised of a decoding unit for sequentially Viterbi-decoding a plurality of data sequences over respective data lengths from the start at the same time and a control unit for sequentially comparing likelihoods of respective data sequences which were simultaneously Viterbi-decoded by the decoding unit and stopping the decoding unit from decoding a certain data sequence if it is determined based upon the compared results that a likelihood of the certain data sequence is lower than a predetermined threshold value.

These decoding apparatus and communication apparatus are adapted to simultaneously receive and decode a plurality of data sequences, for example, and are adapted to judge a desired data sequence by Viterbi-decoding any one of a plurality of data sequences coded by a data sequence assigned to each predetermined communication apparatus from a plurality of data sequences.

According to these decoding apparatus and communication apparatus, since the simultaneous decoding unit sequentially Viterbi-decodes a plurality of data sequences over respective data lengths from the start at the same time, it becomes possible to judge at somewhere of the position from the start of the data length whether or not a data sequence is a useless data sequence that need not be processed. The stop unit sequentially compares likelihoods of respective data sequences which were simultaneously Viterbi-decoded by the simultaneous decoding means. Thus, if it is determined based upon the compared result that a likelihood of a certain data sequence is lower than a specific threshold value, then the stop unit stops the simultaneous decoding means from decoding that data sequence, and all data sequences need not be decoded but the decoding of unnecessary data sequences which need not be processed is stopped. As a result, the useless processing can be decreased.

Further, as described above, according to the present invention, there is provided a decoding method for judging a desired data sequence by Viterbi-decoding any one of a plurality of data sequences encoded by a data sequence assigned to each predetermined communication apparatus from a plurality of data sequences received simultaneously comprising the steps of a simultaneous decoding step for sequentially Viterbi-decoding a plurality of data sequences over respective data lengths from the start at the same time and a stop step for sequentially comparing likelihoods of respective data sequences which are simultaneously Viterbi-decoded by the simultaneous decoding step and stopping the simultaneous decoding step from decoding a certain data sequence if it is determined based upon the compared result that a likelihood of the certain data sequence is lower than a threshold value.

Furthermore, as described above, according to the present invention, when propagation situation, for example, is relatively satisfactory, if a difference between likelihood information between data sequences is large and if expecting received data is judged with ease, then the decode processing can be stopped and hence power consumption can be decreased.

Also, when likelihood information is normalized, if a shared value is used among respective data sequences, then an amount of data that is handled as normalization information for most likelihood comparison can be decreased, which can therefore decrease power consumption.

Having described preferred embodiments of the invention with reference to the accompanying drawings, it is to be understood that the invention is not limited to those precise embodiments and that various changes and modifications could be effected therein by one skilled in the art without departing from the spirit or scope of the invention as defined in the appended claims.

What is claimed is:

1. A decoding apparatus comprising:
   simultaneous decoding means for sequentially Viterbi-decoding a plurality of data sequences over respective data lengths from the start at the same time;
   stop means for sequentially comparing likelihoods of respective data sequences which are simultaneously Viterbi-decoded by said simultaneous decoding means and stopping said simultaneous decoding means from decoding a certain data sequence if it is determined based upon said compared result that a likelihood of said certain data sequence is lower than a threshold value; and
   varying means for varying a time and/or frequency at which said stop means stops said simultaneous decoding means from decoding data sequences based upon data lengths of said plurality of data sequences.

2. A decoding apparatus according to claim 1, further comprising normalization means for normalizing likelihood values of said plurality of data sequences using said compared result as shared normalization information.

3. A decoding apparatus comprising:
   decoding means for sequentially Viterbi-decoding a plurality of data sequences over respective data lengths from the start at the same time;
   a control unit configured to sequentially compare likelihoods of respective data sequences which were simultaneously Viterbi-decoded by said decoding means and stopping said decoding means from decoding a certain data sequence if it is determined based upon said compared result that a likelihood of said certain data sequence is lower than a predetermined threshold value; and
   varying means for varying a time and/or frequency at which said control unit stops said decoding means from decoding data sequences based upon data lengths of said plurality of data sequences.

4. A communication apparatus comprising:
   simultaneous decoding means for sequentially Viterbi-decoding a plurality of data sequences over respective data lengths from the start at the same time;
   stop means for sequentially comparing likelihoods of respective data sequences which are simultaneously Viterbi-decoded by said simultaneous decoding means and stopping said simultaneous decoding means from decoding a certain data sequence if it is determined based upon said compared result that a likelihood of said certain data sequence is lower than a threshold value; and
   varying means for varying a time and/or frequency at which said stop means stops said simultaneous decoding means from decoding data sequences based upon data lengths of said plurality of data sequences.

5. A communication apparatus according to claim 4, further comprising normalization means for normalizing likelihood values of said plurality of data sequences using said compared result as shared normalization information.

6. A communication apparatus comprising:
   decoding means for sequentially Viterbi-decoding a plurality of data sequences over respective data lengths from the start at the same time;
   a control unit configured to sequentially compare likelihoods of respective data sequences which were simultaneously Viterbi-decoded by said decoding means and stopping said decoding means from decoding a certain data sequence if it is determined based upon said compared results if a likelihood of said certain data sequence is lower than a predetermined threshold value; and
   varying means for varying a time and/or freciuency at which said control unit stops said decoding means from decoding data sequences based upon data lengths of said plurality of data sequences.

7. A decoding method for judging a desired data sequence by Viterbi-decoding any one of a plurality of data sequences coded by a data sequence assigned to each predetermined communication apparatus from a plurality of data sequences received simultaneously comprising the steps of:
   a simultaneous decoding step for sequentially Viterbi-decoding a plurality of data sequences over respective data lengths from the start at the same time;
   a stop step for sequentially comparing likelihoods of respective data sequences which are simultaneously Viterbi-decoded by said simultaneous decoding step and stopping said simultaneous decoding step from decoding a certain data sequence if it is determined based upon said compared result that a likelihood of said certain data sequence is lower than a threshold value; and
   a varying step for varying a time and/or frequency at which said stop step stops said simultaneous decoding step from decoding data sequences based upon data lengths of said plurality of data sequences.

8. A decoding method according to claim 7, further comprising a normalization step for normalizing likelihood values of said plurality of data sequences using said compared result as shared normalization information.

9. A decoding apparatus comprising:
a simultaneous decoding unit configured to sequentially Viterbi-decoding a plurality of data sequences over respective data lengths from the start at the same time;
a stop unit configured to sequentially compare likelihoods of respective data sequences which are simultaneously Viterbi-decoded by said simultaneous decoding unit and stopping said simultaneous decoding unit from decoding a certain data sequence if it is determined based upon said compared result that a likelihood of said certain data sequence is lower than a threshold value; and
a varying unit configured to vary a time and/or frequency at which said stop unit stops said simultaneous decoding unit from decoding data sequences based upon data lengths of said plurality of data sequences.

10. The decoding apparatus according to claim 9, further comprising:
a normalization unit configured to normalize likelihood values of said plurality of data sequences using said compared result as shared normalization information.

* * * * *